United States Patent
Greiser et al.

(10) Patent No.: US 10,782,380 B2
(45) Date of Patent: Sep. 22, 2020

(54) TRIGGER-ADAPTED MR DATA ACQUISITION

(71) Applicant: Siemens Healthcare GmbH, Erlangen (DE)

(72) Inventors: Andreas Greiser, Erlangen (DE); Dominik Paul, Bubenreuth (DE); Thorsten Speckner, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 702 days.

(21) Appl. No.: 15/592,296

(22) Filed: May 11, 2017

(65) Prior Publication Data
US 2017/0328975 A1 Nov. 16, 2017

(30) Foreign Application Priority Data
May 11, 2016 (DE) .................. 10 2016 208 094

(51) Int. Cl.
*G01R 33/561* (2006.01)
*G01R 33/567* (2006.01)
*G01R 33/28* (2006.01)
*G01R 33/54* (2006.01)

(52) U.S. Cl.
CPC ....... *G01R 33/5673* (2013.01); *G01R 33/288* (2013.01); *G01R 33/543* (2013.01)

(58) Field of Classification Search
CPC .................. A61B 5/7285; G01R 33/5673
See application file for complete search history.

(56) References Cited

U.S. PATENT DOCUMENTS

| | | | | |
|---|---|---|---|---|
| 5,260,656 | A | * 11/1993 | Cory | G01R 33/4816 324/307 |
| 2012/0271155 | A1* | 10/2012 | Stemmer | A61B 5/055 600/413 |
| 2013/0169273 | A1* | 7/2013 | Grodzki | G01R 33/4816 324/309 |

* cited by examiner

*Primary Examiner* — Alesa Allgood
(74) *Attorney, Agent, or Firm* — Schiff Hardin LLP

(57) ABSTRACT

In trigger-adapted MR data acquisition, a trigger from the object undergoing investigation is detected, by which a periodically repeated procedure of the object is detected. An imaging sequence is performed multiple times dependent on the trigger in order to acquire MR data. The imaging sequence includes at least one preparation pulse and a subsequent readout module, the readout module ending a first time period before an end of the procedure. The respective imaging sequence is performed only if RR≥RR(0)−(dRR−dRR(B1)), wherein dRR(B1) is a second time period, RR corresponds is a first time interval between a trigger that is currently being detected and a trigger that was detected immediately before the currently detected trigger, and RR(0) is a second time interval that corresponds to a predefined time interval between two directly succeeding triggers.

13 Claims, 4 Drawing Sheets

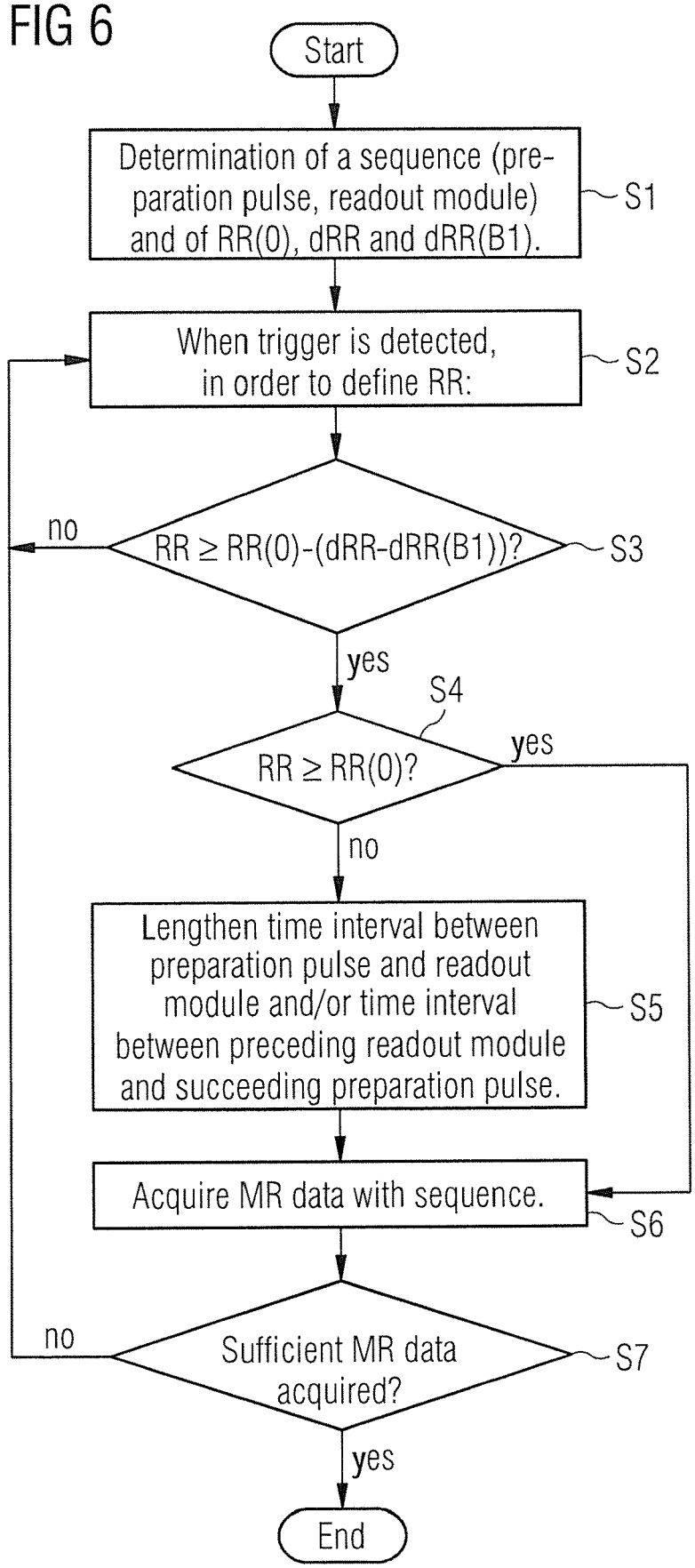

TRIGGER-ADAPTED MR DATA ACQUISITION

BACKGROUND OF THE INVENTION

Field of the Invention

The present invention concerns data acquisition that is adapted to a trigger, using a magnetic resonance apparatus.

Description of the Prior Art

In the case of cardio MRI measurements, for example, MR data acquisition is adapted to the patient's heartbeat. If this heartbeat changes, in particular becoming faster, it may occur that the selected imaging sequence of the magnetic resonance apparatus cannot be performed because the maximum available RF output of the magnetic resonance apparatus is exceeded. Exceeding the maximum available RF output of the magnetic resonance apparatus may then result in termination of the imaging sequence.

SUMMARY OF THE INVENTION

An object of the present invention is to prevent the maximum available RF output of a magnetic resonance apparatus (i.e., the scanner thereof, from being exceeded during MR data acquisition that is adapted to a trigger.

Within the context of the present invention, a method is provided for the acquisition of MR data from a living object undergoing investigation, wherein this method includes the following steps.

A trigger from the object undergoing investigation is detected, and a periodically repeated procedure of the object undergoing investigation (such as a heartbeat or respiration, thus a physiological cycle, for example an RR interval in the ECG) is detected using the trigger. It is then possible, using the trigger, for the acquisition of MR data to be adapted to or synchronized with the corresponding procedure.

An imaging sequence is then performed dependent on the trigger, in order to acquire the MR data of the object undergoing investigation. This step is carried out multiple times, with the result that the imaging sequence is created multiple times. Here, the term "imaging sequence" means a part or a section of a complete sequence. This imaging sequence is used to measure or acquire the data of one of a number of procedures.

Here, the imaging sequence includes at least one preparation pulse (to be more precise, a magnetization preparation pulse) and a readout module that occurs after this preparation pulse and is used to acquire the MR data. The timing of carrying out the readout module is planned such that the readout module occurs in, or ends, a first time period dRR before a planned end of the procedure.

In addition, in another method step in which the following condition is checked for the equation $$RR \geq RR(0) - (dRR - dRR(B1)) \qquad (1)$$

Here, dRR(B1) corresponds to a second time period that is determined or predefined. RR designates a first time interval between the trigger that is currently being detected and the trigger that was detected immediately before the currently detected trigger. RR(0) corresponds to a second predefined time interval between two directly succeeding triggers. Thus, while RR(0) corresponds to a planned time interval between two triggers that provides the basis for example for planning of the imaging sequence, the time interval RR is the actually measured time interval between what are currently the last two triggers of the object undergoing investigation. Thus, RR(0) corresponds to a kind of setpoint value, while RR corresponds to the actual value.

According to the invention, the respective imaging sequence is only created if the condition of equation (1) is met for the trigger currently being detected.

The first time period dRR may be regarded as a time buffer between the end of the readout module and the beginning of the next preparation pulse. Since the actual start of the imaging sequence that is respectively currently being performed, thus the point in time at which the preparation pulse is run, depends on the trigger, this time buffer is at times larger and at times smaller (for example because of the physiological variability in the heart rate). However, if this time buffer becomes too small, then the case may in particular arise that the maximum average RF output of the magnetic resonance apparatus is exceeded, as described above. As a result of introducing the second time period dRR(B1) and the above-described check of equation (1), it is advantageously ensured that the time interval can never be too small. As a result of an appropriate selection of the first time period dRR and in particular of the second time period dRR(B1), it can be ensured that the maximum (average) RF output of the magnetic resonance apparatus is never exceeded.

Non-fulfillment of the condition of equation (1) typically occurs only very seldom in the course of measurement (for example in only one of 15 heartbeats (typical breath-hold phase)). This may be taken into account for example in that the measurement time is provided to be correspondingly longer. For example, the measurement time may be lengthened right from the outset in order to compensate for the loss of measurement data if the condition of equation (1) is not met during the measurement. Alternatively, the measurement is only lengthened appropriately if the condition of equation (1) is not met during the currently performed measurement.

Here, the second time period should in particular be selected in dependence on the first time period dRR such that the average B1 output or RF output of the magnetic resonance apparatus is reliably kept below a predefined maximum value during performance of the respective imaging sequence. Here, the term "average" B1 output or RF output of the magnetic resonance apparatus should be understood to mean a kind of integral of the RF output over a certain time range (for example 100 ms). In other words, the second time period is selected such that this integral of the RF output never lies above the predefined maximum value while the respective imaging sequences are being performed.

If the average RF output corresponds to the mean output over the last 100 ms, the maximum limit value will be, for example, 2.23 µT.

In addition, a first time interval between the end of the readout module and the beginning of the following preparation pulse may be lengthened.

If, for example, in dependence on the trigger the first time interval between the end of the readout module and the beginning of the following preparation pulse is deemed to be too small, the beginning of the following preparation pulse and hence the start of the next imaging sequence may be delayed somewhat, as a result of which the average RF output is advantageously reduced.

Similarly, it is possible to lengthen a second time interval between the end of the preparation pulse and the beginning of the readout module of the same sequence for the next imaging sequence.

By lengthening the second time interval, thus the time gap between the end of the preparation pulse and the beginning of the readout module, the average RF output of the magnetic resonance apparatus is advantageously reduced. If as a result, for example in dependence on the trigger, the above-described first time interval between the end of the readout module and the beginning of the following preparation pulse is deemed to be too small to keep the average RF output reliably below the maximum value, then lengthening the second time interval may result in a reduction in the average RF output. Accordingly, lengthening the second time interval may be combined with lengthening the first time interval.

The detected trigger is an identifiable feature or characteristic in an electronic representation of the periodically repeating procedure of the patient, such as an electrical signal or an MR navigator, for example. With the trigger, the heart rate or the current heartbeat of the object undergoing investigation (the patient), may be detected. Using the trigger, however, the respiration or the current breath taken by the patient may also be detected.

As the preparation pulse, one or more of the following pulses may be used: a blood suppression pulse (for example comprising a combination of a selective and a non-selective inversion pulse), an RF pulse for suppressing components having a short T2 time, a fat saturation pulse, an inversion pulse, a saturation pulse.

In an embodiment of the invention, planned imaging sequences may be simulated before they are actually performed. Using this simulation it is then possible to determine whether performing the imaging sequences would bring the average RF output of the magnetic resonance apparatus above the predefined maximum value. This simulation takes into account the fact that the first time interval between the end of the readout module and the beginning of the next preparation pulse may be lengthened at most by a predefined time period, and/or that the second time interval between the end of the preparation pulse and the beginning of the readout module of the same imaging sequence may be lengthened at most by another predefined time period.

By taking into account a possible lengthening of the first and/or the second time interval, variants of the present invention can be taken into account in the simulation according to the invention, as a result of which the results of the simulation are more precise in determining the maximum average RF output. As a result, a check made using the simulation as to whether planned imaging sequences result in the average RF output being above the predefined maximum value advantageously gives more precise results.

This enables a very precise check to take place, using the simulation according to the invention, as to whether planned imaging sequences will result in the average RF output required for this being above the predefined maximum value.

The present invention also encompasses a magnetic resonance apparatus for the acquisition of MR images of a predefined volume section in an object undergoing investigation. The magnetic resonance apparatus has a data acquisition scanner that has a basic field magnet, a gradient field system, at least one RF antenna and a control computer that controls the gradient field system and the at least one RF antenna, in order to receive measurement signals that are detected by the RF antenna or antennas, and to evaluate the measurement signals and generate MR images therefrom. The magnetic resonance apparatus is operated so as to detect a trigger from the object undergoing investigation, by which a periodically repeated procedure of the object undergoing investigation is detected, and so that the magnetic resonance apparatus creates, multiple times, an imaging sequence dependent on the trigger in order to acquire the MR data. The imaging sequence includes at least one preparation pulse and a readout module following this preparation pulse. The magnetic resonance apparatus is further operated so as to time the readout module such that the readout module ends a first time period dRR before an end of the respective periodically repeated procedure. Moreover, the magnetic resonance apparatus is operated to check the above-described condition of equation (1) and to perform the respective imaging sequence only if this condition is met.

The advantages of the magnetic resonance apparatus according to the invention correspond substantially to the advantages of the method according to the invention as described in detail above.

The present invention also encompasses a non-transitory, computer-readable data storage medium encoded with programming instructions that, when the storage medium is loaded into a programmable control computer of a magnetic resonance apparatus, cause the control computer to operate the magnetic resonance apparatus in order to implement the method as described above, by execution of the program code.

The computer program product may require programming aids such as libraries and auxiliary functions in order to produce the corresponding embodiments of the methods. In other words, the claim that relates to the computer program product is intended to protect in particular a computer program or software by means of which one of the above-describe embodiments of the method according to the invention can be produced or that produces this embodiment. Here, the software may be a source code (such as C++) that has also to be compiled (translated) and linked or that has only to be interpreted, or it may be an executable software code that has also to be loaded into the corresponding processor unit or control device in order to be executed.

The electronically readable data medium can be a DVD, a magnetic tape, a hard disk or a USB stick on which electronically readable control information is stored.

The present invention ensures that there is a minimal required wait time between the readout module and the following preparation pulse in order to keep the (average) RF output of the magnetic resonance apparatus below a predefined maximum value.

The invention can be combined with any types of magnetization preparations in conjunction with triggering. Moreover, the present invention can be transferred to any other kinds of physiological triggering (such as respiration).

BRIEF DESCRIPTION OF THE DRAWINGS

FIG. 6 is a flowchart of the method according to the invention.

DESCRIPTION OF THE PREFERRED EMBODIMENTS

Figure 1:
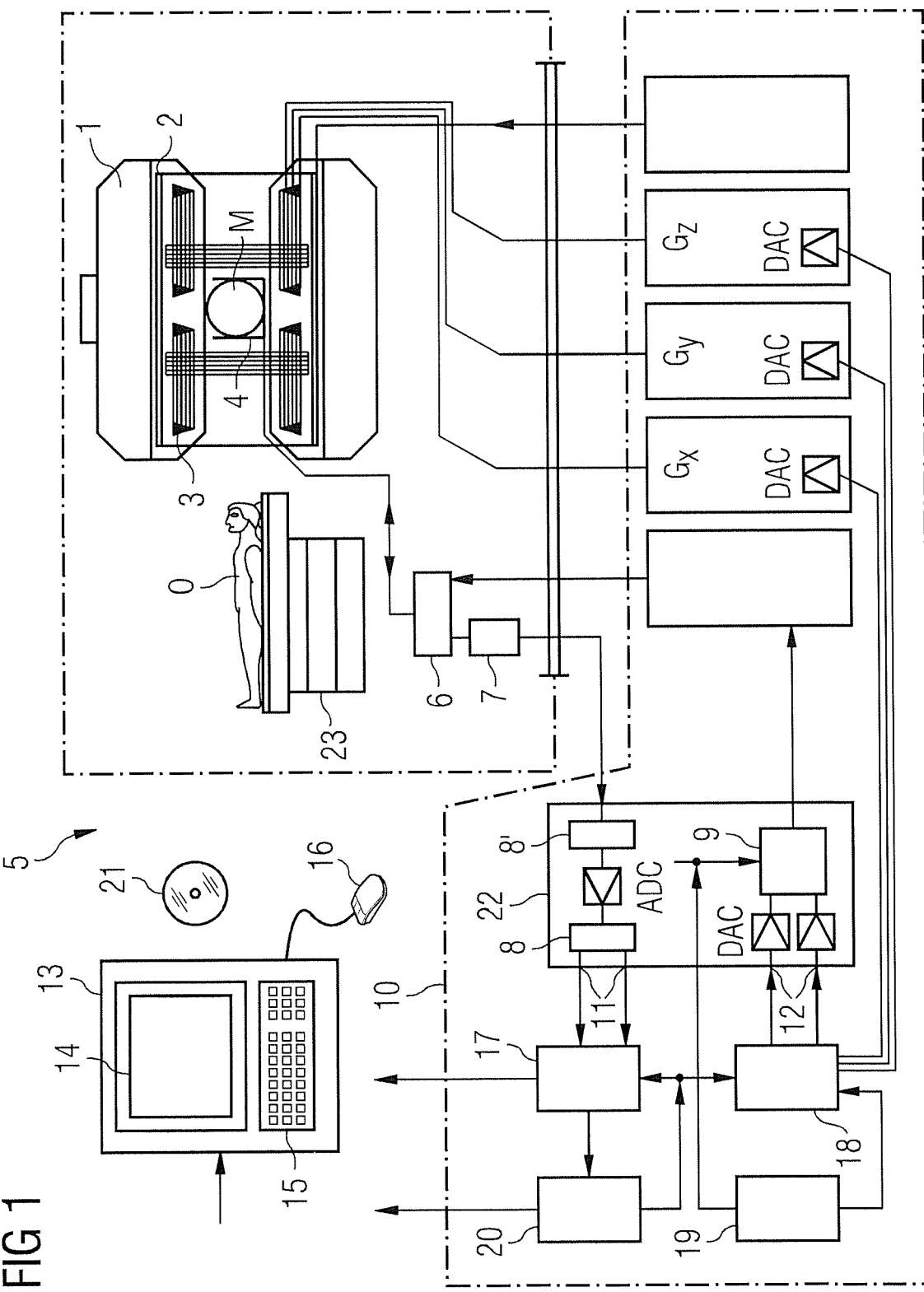
FIG. 1 schematically illustrates a magnetic resonance apparatus according to the invention.

FIG. 1 is a schematic illustration of a magnetic resonance (MR) apparatus 5 according to the invention (a magnetic resonance imaging tomography apparatus). The MR data acquisition scanner of the apparatus 5 has a basic field magnet 1 that generates a strong basic magnetic field that is constant over time, for the polarization or alignment of nuclear spins in an area being investigated in an object O, such as an anatomy to be investigated of a human body, who is examined in the scanner while lying on a platform 23. The high level of homogeneity of the basic magnetic field that is required for measurement of the magnetic resonance signals is defined in a typically spherical measurement volume M, in which the volume that is to be investigated of the human body is arranged. To aid the homogeneity requirements, and in particular to eliminate factors that are invariable over time, so-called shim plates made of ferromagnetic material are mounted at a suitable location in the scanner. Factors that are variable over time are eliminated by shim coils 2.

Inserted into the basic field magnet 1 is a cylindrical gradient field system 3, which has three sub-windings. Each sub-winding is supplied with current by an amplifier, in order to generate a linear gradient field (which is also variable over time) in the respective directions of a Cartesian coordinate system. Here, the first sub-winding of the gradient field system 3 generates a gradient $G_x$ in the x-direction, the second sub-winding generates a gradient $G_y$ in the y-direction and the third sub-winding generates a gradient $G_z$ in the z-direction. Each amplifier includes a digital-to-analog converter that is controlled by a sequence controller 18 for generating gradient pulses at the correct time.

Within the gradient field system 3 there is one or more radio-frequency antennas 4, which convert the radio-frequency pulses that are emitted by a radio-frequency power amplifier into an alternating magnetic field for the purpose of exciting nuclei of the object O so as to give their nuclear spins a magnetization that deflects the excited spins from the alignment produced by the basic magnetic field. Each radio-frequency antenna 4 has one or more RF emitting coils and one or more RF receiving coils in the form of an annular arrangement, preferably a linear or matrix-type arrangement, of component coils. The alternating field from the excited nuclear spins, typically nuclear spin echo signals caused by a pulse sequence composed of one or more radio-frequency pulses and one or more gradient pulses, is converted into a voltage (measurement signal) by the RF receiving coils of the respective radio-frequency antenna 4, and this voltage is applied via an amplifier 7 to a radio-frequency receiving channel 8 of a radio-frequency system 22. The radio-frequency system 22, which is part of a control computer 10 of the magnetic resonance apparatus 5, furthermore includes a transmitting channel 9 in which the radio-frequency pulses for exciting the nuclear magnetic resonance are generated. The respective radio-frequency pulses are represented digitally as a sequence of complex numbers, on the basis of a pulse sequence predefined by the system processor 20, in the sequence controller 18. This numerical sequence is supplied as a real part and an imaginary part via respective inputs 12 to a digital-to-analog converter in the radio-frequency system 22, and from there to a transmitting channel 9. In the transmitting channel 9, the pulse sequences are modulated to a radio-frequency carrier signal, the basic frequency of which corresponds to the resonant frequency of the nuclear spins in the measurement volume.

Switch-over from emitting to receiving mode is carried out by a diplexer 6. The RF emitting coils of the radio-frequency antenna(s) 4 direct radiation of the radio-frequency pulses for exciting the nuclear spins into the measurement volume M, and the resulting echo signals are scanned by the RF receiving coil(s). The accordingly obtained nuclear resonance signals are demodulated in a phase-sensitive manner in the receiving channel 8' (first demodulator) of the radio-frequency system 22 to give an intermediate frequency, are digitalized in the analog-to-digital converter (ADC), and are emitted via the output 11. This signal is demodulated again to give the frequency 0. Demodulation to the frequency 0, and separation into the real part and the imaginary part, take place downstream of the digitalization in the digital domain in a second demodulator 8. An MR image is reconstructed by an image processor 17 from the measurement data that are obtained in this way. Management of the measurement data, the image data and the control programs is performed by the system processor 20. By the provision according to the invention with control programs, the sequence controller 18 controls the generation of the respectively desired pulse sequences and the corresponding scanning of (date entry into) k-space. The sequence controller 18 controls activation of the gradients at the proper time, emission of the radio-frequency pulses having a defined phase amplitude, and reception of the magnetic resonance signals. The time base for the radio-frequency system 22 and the sequence controller 18 is provided by a synthesizer 19. The selection of corresponding control programs for generating an MR image, which are stored for example on a DVD 21, and the representation of the generated MR image are performed, at a terminal 13 that includes a keyboard 15, a mouse 16 and a screen 14.

Figure 2:
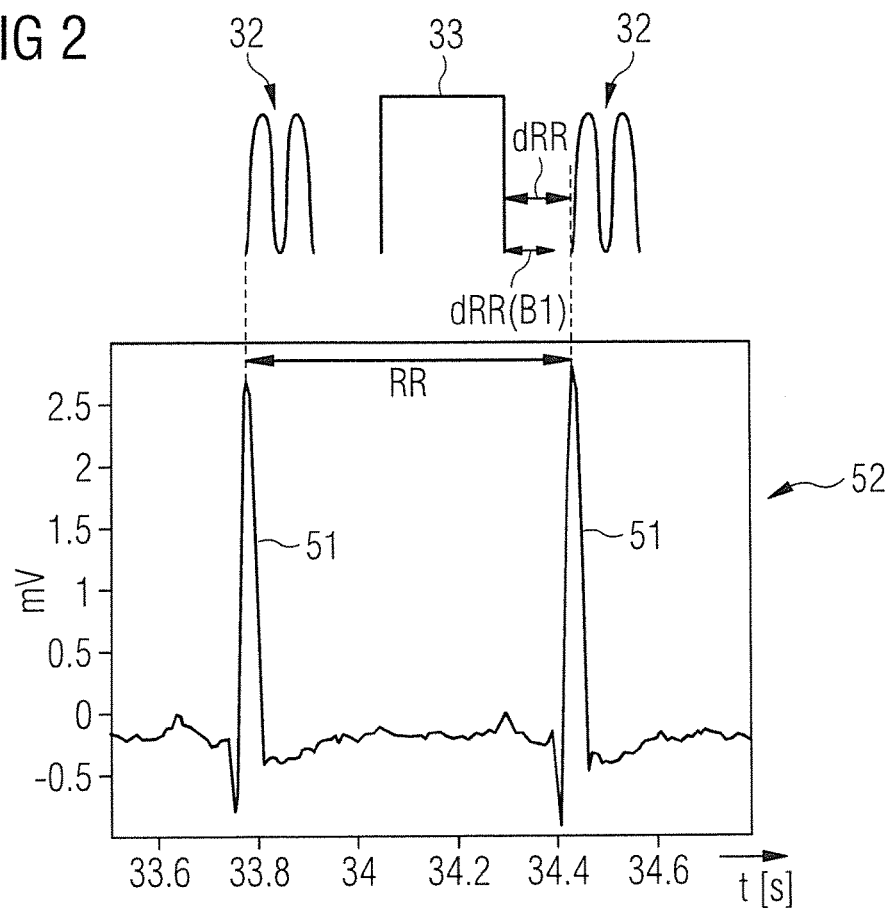
FIG. 2 illustrates an imaging sequence according to the invention, together with an ECG.

FIG. 2 illustrates an imaging sequence according to the invention with the example of an ECG 52 as the representation of the aforementioned periodically repeating procedure of the object O, in which the trigger is detected. The imaging sequence begins at the time of the R-wave 51, which is illustrated on the left in FIG. 2, with a preparation pulse 32 of the sequence. MR data of the patient are then acquired using the readout module 33 that follows the preparation pulse 32. The readout module 33 ends a time period dRR before the second R-wave 51 (on the right in FIG. 2). The time of this second R-wave 51 also corresponds to that of the beginning of the second imaging sequence, or the beginning of the next preparation pulse 32. This situation will be described again below from other observation perspective.

Each imaging sequence, which includes the preparation pulse 32 and the succeeding readout module 33, is synchronized in dependence on the ECG of the object undergoing investigation, or patient. The respective imaging sequence typically begins at the point in time at which an R-wave 51 is detected in the ECG 52. For example, with the use of pre-measurements, a setpoint RR(0) is defined for the time interval between two R-waves 51 of the patient to be investigated. Using this setpoint value RR(0), each imaging sequence is planned such that the readout module 33 ends the time period dRR before the next R-wave 51. Because the readout module 33 in FIG. 2 also ends the time period dRR before the second R-wave 51 (on the right in FIG. 2), the time period or the actual value RR in the situation illustrated in FIG. 2 corresponds precisely to the setpoint value RR(0).

In other words, using the R-waves 51, periodically repeated procedures of the object undergoing investigation are detected, so the patient's heart rate is in practice detected in each case. The time at which a (new) procedure begins and hence the time at which the previous procedure ends in each case correspond to the point in time at which an R-wave 51 is detected. In each of these procedures, when possible, an imaging sequence 32, 33 is to be performed in order to acquire MR data during the procedure (heartbeat). The above-described setpoint value RR(0) accordingly corresponds to a type of setpoint value for the duration of the respective procedure, while the actual value RR corresponds to the real duration of the respective procedure.

If the actual value RR(0) is a longer time than the setpoint value RR, the next imaging sequence begins correspondingly later, which does not present a problem. If, however, the actual value RR(0) is a shorter time than the setpoint value RR, the next imaging sequence would have to begin correspondingly earlier. This would cause the time interval between the end of the readout module 33 of the last imaging sequence and the beginning of the preparation pulse 32 of the next imaging sequence to become correspondingly shorter. This shortening would cause the average RF output of the magnetic resonance scanner to rise, since more RF pulses are generated per unit time than if the actual value RR(0) corresponds to the setpoint value RR.

So that the shortening of the actual value RR (namely, the quickening of the heart rate) can be taken into account, the time period dRR was taken into account when planning the imaging sequences. However, the invention is based on the insight that even in this case only a certain level of shortening of the actual value RR (a quicker heart rate) can be coped with without either the average RF output of the magnetic resonance scanner exceeding a predefined maximum value or too great a sacrifice having to be accepted of the quality of the acquired MR values. If, however, the above-described equation (1) is no longer fulfilled, this level of shortening of the actual value RR is exceeded. In this case, no MR data are acquired during the next procedure or heartbeat, thus no imaging sequence is performed.

As long as equation (1) is fulfilled, the time interval between the end of the readout module 33 of the current procedure or heartbeat and the beginning of the succeeding procedure or heartbeat is greater than the time period dRR (B1). The time period dRR(B1) is accordingly selected in dependence on the performance of the magnetic resonance scanner such that it is as small as possible while still being sufficiently large so as to ensure that the succeeding imaging sequence can be performed without the average RF output of the magnetic resonance apparatus exceeding the predefined maximum value.

Figure 3:
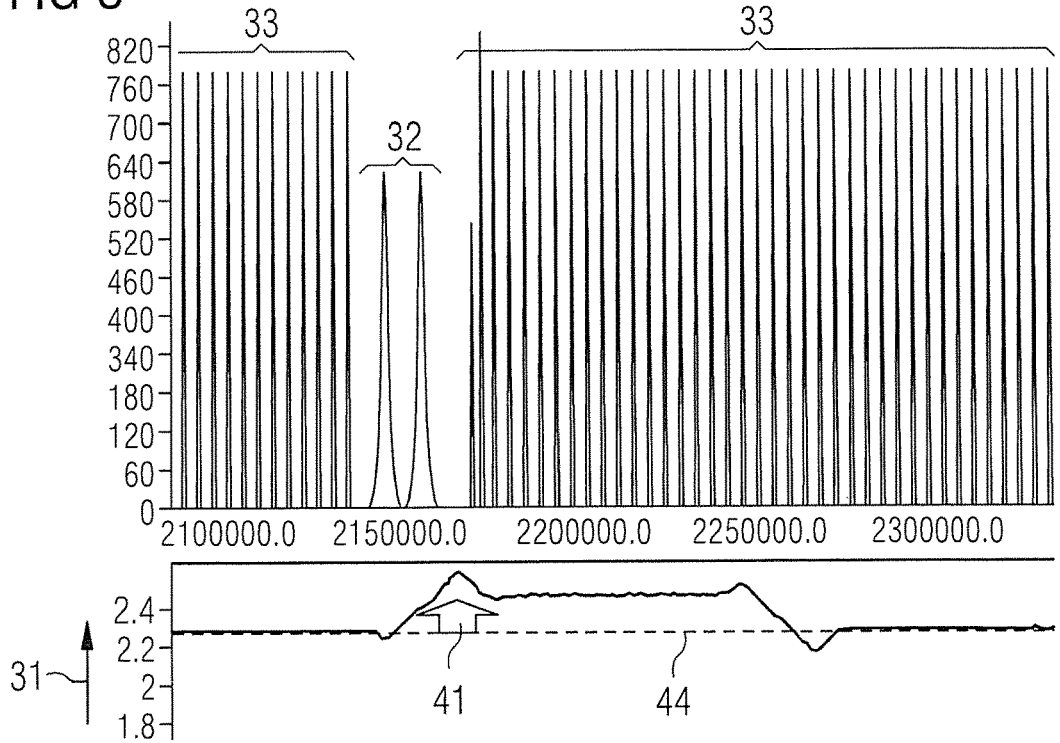
FIGS. 3 to 5 show particular situations in the MR data acquisition.

FIG. 3 illustrates a situation in which the actual value RR is a shorter time than the setpoint value RR(0), with the result that the average RF output exceeds the predefined maximum value. In order to show this, the average RF output or B1 output 31 of the magnetic resonance apparatus over time (in each case the integral over the last 100 ms) is illustrated below the image sequence 32, 33. Since the time interval between the end of the last readout module 33 (on the left in FIG. 3) and the beginning of the preparation pulse 32 of the next imaging sequence is too short, because of the faster heart rate RR, the mean RF output 31 rises, just after the preparation pulse 32, above the predefined maximum value 44, as a result of which the measurement sequence would be terminated 41.

Figure 4:
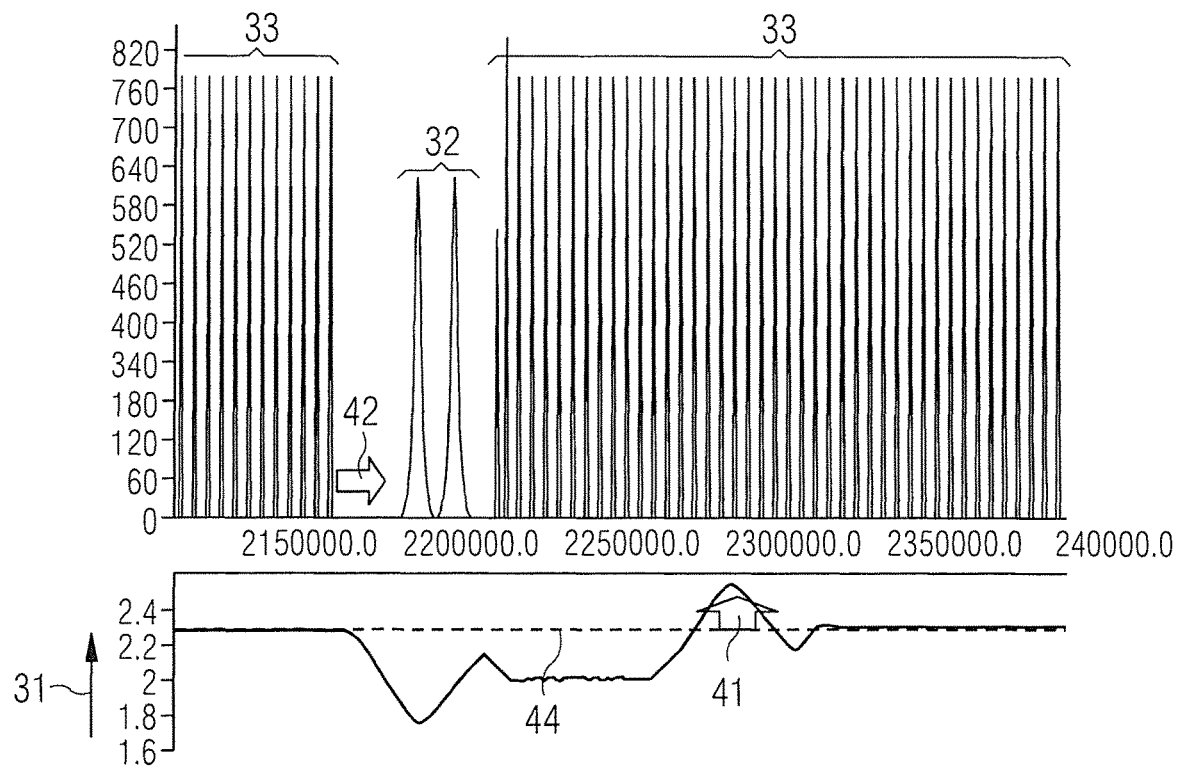

In FIG. 4, a similar situation to that in FIG. 3 is illustrated, in which the actual value RR is a shorter time than the setpoint value RR(0). To avoid the average RF output 31 exceeding the predefined maximum value 44, the time interval 42 between the end of the last readout module 33 (on the left in FIG. 4) and the beginning of the preparation pulse 32 of the following imaging sequence has been made larger than that in FIG. 3. As a result, although the mean RF output 31 falls by comparison with that in FIG. 3, during the readout module 33 of the following imaging sequence it rises above the predefined maximum value 44, as a result of which the measurement sequence would be terminated at 41 as in FIG. 3 (albeit later).

Figure 5:
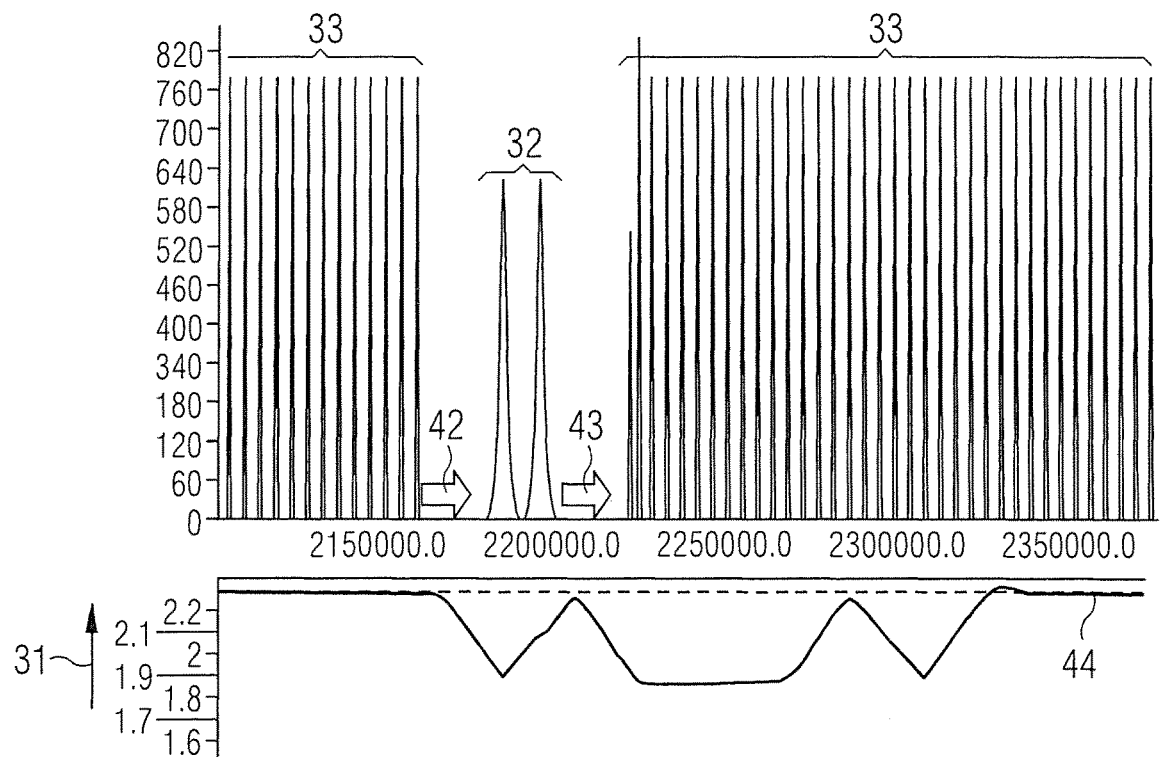

FIG. 5 illustrates a situation in which, similarly to FIGS. 3 and 4, the actual value RR is a shorter time than the setpoint value RR(0). To prevent the average RF output 31 from exceeding the predefined maximum value 44, the time interval 42 between the end of the last readout module 33 (on the left in FIG. 5) and the beginning of the preparation pulse 32 of the following imaging sequence, and in addition the time interval 43 between the end of the preparation pulse 32 and the following readout module 33, are each made larger than in FIG. 3. These two measures have the result that the average RF output does not exceed the predefined maximum value during performance of the following imaging sequence either.

FIG. 6 illustrates a flowchart of an embodiment according to the invention.

In a first step S1, the imaging sequence, the time periods dRR (for example of 60 ms) and dRR(B1) (for example of 15 ms) and the setpoint value for the time interval between two succeeding triggers are determined. For a cardio MRI measurement, the setpoint value may be set for example as the mean value of a certain number of measured heartbeats, in some cases plus a safety value of 60 ms. The standardized imaging sequence is then planned such that the readout module 33 ends the time period dRR before the next trigger, a precondition of this plan being that the time interval between two succeeding triggers corresponds to the setpoint value.

When the next trigger is detected, in step S2, the actual value RR is set as the time interval between the preceding trigger and the currently detected trigger. Then, in step S3, a check is made as to whether the condition of equation (1) is met. If this is not the case (that is to say that the actual value RR is too small), the next heartbeat is not detected and the method returns to step S2.

If by contrast the condition of equation (1) is met, then a check is made in step S4 as to whether the actual value RR is greater than or equal to the setpoint value RR(0). If this is the case, the planned imaging sequence can be performed unchanged, with the result that MR data is acquired in step S6 with this sequence.

If by contrast the actual value RR is smaller than the setpoint value RR(0), either the time interval between the preparation pulse and the readout module for the next imaging sequence is lengthened, or the time interval between the readout module of the preceding imaging sequence and the preparation pulse of the next imaging sequence is lengthened. It is also possible for both time intervals to be lengthened. The corresponding changed imaging sequence is performed in step S6 in order to acquire MR data. Then, in step S7, a check is made as to whether a sufficient number of MR data points has been acquired yet. If this is the case, the method is ended, and if it is not the case, the method jumps back to step S2.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus to acquire MR data from a subject situated in the MR apparatus, said method comprising:

detecting a physiological trigger from the subject in the MR apparatus and providing said trigger to a computer;
  in said computer, detecting, from said trigger, a periodically repeated procedure that occurs within the subject;

from said computer, operating the MR apparatus to radiate radio-frequency (RF) energy into the subject and to perform an imaging sequence multiple times, with each repetition of the imaging sequence being dependent on said trigger, to acquire MR data from the subject, said imaging sequence comprising at least one preparation pulse and a subsequent readout module;

in said computer, timing an occurrence of said readout module in each of said repetitions so that said readout module ends a first time period dRR before an end of said periodically repeated procedure;

in said computer, determining a second time period dRR(B1) to maintain an average RF energy output of said MR apparatus below a predetermined maximum value during a respective repetition of said imaging sequence;

in said computer, operating said MR apparatus to perform said imaging sequence only when:

$$RR>RR(0)-(dRR-dRR(B1)),$$

wherein RR corresponds to a first time interval between a currently detected trigger and a trigger that was detected immediately before said currently detected trigger, and wherein RR(0) is a second time interval that corresponds to a predetermined time interval between two successive triggers.

2. The method as claimed in claim 1, wherein said second time period is dependent upon and less than said first time period.

3. The method as claimed in claim 1, comprising:
when it is determined in said computer that RR is not greater than or equal to RR(0)-(dRR-dRR(B1)), then, from said computer, lengthening a time interval in said imaging sequence between an end of the readout module and a beginning of the preparation pulse.

4. The method as claimed in claim 1, comprising:
when it is determined in said computer that RR is not greater than or equal to RR(0)-(dRR-dRR(B1)), then, from said computer, lengthening a time interval in said imaging sequence between an end of the preparation pulse and a beginning of the readout module.

5. The method as claimed in claim 1, comprising:
in said computer, using said trigger to detect, as said periodically repeated procedure, a procedure including at least one of the heartbeat of the subject and the respiration of the subject.

6. The method as claimed in claim 1, comprising:
operating said MR apparatus from said computer with said preparation pulse configured as a pulse including at least one of a blood suppression pulse, a radio-frequency pulse that suppresses components having a short T2 time, a fat saturation pulse, an inversion pulse, and a saturation pulse.

7. The method as claimed in claim 1, comprising:
in said computer, simulating performance of said imaging sequence, in order to produce a simulated imaging sequence;

from said simulated imaging sequence, determining whether performing said imaging sequence would cause the average RF energy output of said MR apparatus to exceed the predetermined maximum value; and when it is determined from the simulated imaging sequence that said average RF energy output of said MR apparatus exceeds said predetermined value, modifying said imaging sequence to lengthen at least one of (i) a time interval between an end of the readout module and a beginning of the preparation pulse, and (ii) a time interval between an end of the preparation pulse and a beginning of the readout module.

8. The method as claimed in claim 1, wherein the second time period occurs within the first time period.

9. The method as claimed in claim 1, comprising:
when it is determined in said computer that RR is not greater than or equal to RR(0)-(dRR-dRR(B1)), modifying, via the computer, the imaging sequence to lengthen at least one of (i) a time interval in said imaging sequence between an end of the readout module and a beginning of the preparation pulse, and (ii) a time interval in said imaging sequence between an end of the preparation pulse and a beginning of the readout module.

10. The method as claimed in claim 1, comprising:
modifying, via the computer, the imaging sequence to lengthen at least one of (i) a time interval between an end of the readout module and a beginning of the preparation pulse, and (ii) a time interval between an end of the preparation pulse and a beginning of the readout module when it is determined, via the computer, that a simulated imaging sequence would cause the average RF energy output of the MR apparatus to exceed the predetermined maximum value.

11. The method as claimed in claim 1, wherein:
the predetermined time interval RR(0) corresponds to a setpoint value associated with a planned time interval that is defined in accordance with the imaging sequence, the first time interval RR corresponds to a measured time interval upon performing the imaging sequence, and the predetermined time interval RR(0) is different than the first time interval RR.

12. A magnetic resonance (MR) apparatus comprising:
an MR data acquisition scanner; and
a processor configured to:
receive a physiological trigger from a subject in the MR data acquisition scanner detect, from said trigger, a periodically repeated procedure that occurs within the subject;

operate the MR apparatus to radiate radio-frequency (RF) energy into the subject and to perform an imaging sequence multiple times, with each repetition of the imaging sequence being dependent on said trigger, to acquire MR data from the subject, said imaging sequence comprising at least one preparation pulse and a subsequent readout module;

time an occurrence of said readout module in each of said repetitions so that said readout module ends a first time period dRR before an end of said periodically repeated procedure;

determine a second time period dRR(B1) to maintain an average RF energy output of said MR apparatus below a predetermined maximum value during a respective repetition of said imaging sequence; and operate said MR apparatus to perform said imaging sequence only when:

$$RR>RR(0)-(dRR-dRR(B1)),$$

wherein RR corresponds to a first time interval between a currently detected trigger and a trigger that was detected immediately before said currently detected trigger, and wherein RR(0) is a second time interval that corresponds to a predetermined time interval between two successive triggers.

13. A non-transitory, computer-readable data storage medium encoded with programming instructions, said storage medium being loaded into a control computer of magnetic resonance (MR) apparatus, said programming instructions when executed by one or more processors of the control computer causing said control computer to:
   detect a physiological trigger from a subject in the MR apparatus;
   detect, from said trigger, a periodically repeated procedure that occurs within the subject;
   operate the MR apparatus to radiate radio-frequency (RF) energy into the subject and to perform an imaging sequence multiple times, with each repetition of the imaging sequence being dependent on said trigger, to acquire MR data from the subject, said imaging sequence comprising at least one preparation pulse and a subsequent readout module;
   time an occurrence of said readout module in each of said repetitions so that said readout module ends a first time period dRR before an end of said periodically repeated procedure;
   determine a second time period dRR(B1) to maintain an average RF energy output of said MR apparatus below a predetermined maximum value during a respective repetition of said imaging sequence; and
   operate said MR apparatus to perform said imaging sequence only when:

$RR > RR(0) - (dRR - dRR(B1))$, wherein RR corresponds to a first time interval between a currently detected trigger and a trigger that was detected immediately before said currently detected trigger, and
   wherein RR(0) is a second time interval that corresponds to a predetermined time interval between two successive triggers.

* * * * *